(12) United States Patent
Thei et al.

(10) Patent No.: US 8,502,326 B2
(45) Date of Patent: Aug. 6, 2013

(54) GATE DIELECTRIC FORMATION FOR HIGH-VOLTAGE MOS DEVICES

(75) Inventors: Kong-Beng Thei, Hsin-Chu (TW); Jiun-Lei Jerry Yu, Zhudong Township (TW); Chien-Chih Chou, Zhubei City (TW); Chun-Lin Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 337 days.

(21) Appl. No.: 12/888,113

(22) Filed: Sep. 22, 2010

(65) Prior Publication Data
US 2011/0133276 A1 Jun. 9, 2011

Related U.S. Application Data

(60) Provisional application No. 61/266,433, filed on Dec. 3, 2009.

(51) Int. Cl.
*H01L 21/02* (2006.01)
*H01L 21/3205* (2006.01)

(52) U.S. Cl.
USPC ............... 257/411; 257/E21.192; 438/591

(58) Field of Classification Search
None
See application file for complete search history.

(56) References Cited

U.S. PATENT DOCUMENTS
2005/0130365 A1* 6/2005 Noda et al. ............... 438/216

FOREIGN PATENT DOCUMENTS
JP 2004235214 A 8/2004

* cited by examiner

*Primary Examiner* — Michael Lebentritt
*Assistant Examiner* — Kevin Quinto
(74) *Attorney, Agent, or Firm* — Slater & Matsil, L.L.P.

(57) ABSTRACT

An integrated circuit structure includes a semiconductor substrate and a high-voltage metal-oxide-semiconductor (HV-MOS) device, which includes a first high-voltage well (HVW) region of a first conductivity type in the semiconductor substrate; a drain region of a second conductivity type opposite the first conductivity type in the semiconductor substrate and spaced apart from the first HVW region; a gate dielectric with at least a portion directly over the first HVW region; and a gate electrode over the gate dielectric. The gate dielectric includes a bottom gate oxide region; and a silicon nitride region over the bottom gate oxide region.

19 Claims, 11 Drawing Sheets

GATE DIELECTRIC FORMATION FOR HIGH-VOLTAGE MOS DEVICES

This application claims the benefit of U.S. Provisional Application No. 61/266,433 filed on Dec. 3, 2009, entitled "Gate Dielectric Formation for High-Voltage MOS Devices," which Application is hereby incorporated herein by reference.

TECHNICAL FIELD

This disclosure relates generally to integrated circuit devices, and more particularly to structures of high-voltage metal-oxide-semiconductor (HVMOS) devices and methods of forming the same.

BACKGROUND

High-voltage metal-oxide-semiconductor (HVMOS) devices are widely used for many types of high-voltage circuits such as input/output circuits, CPU power supply circuits, power management systems, AC/DC converters, etc. The commonly seen HVMOS devices include lateral-diffused metal-oxide-semiconductor (LDMOS) devices and double-diffused drain MOS (DDDMOS) devices. HVMOS devices may include lightly doped well regions in order to enhance the breakdown voltages.

HVMOS devices need to sustain high voltages. Accordingly, the gate dielectrics of the HVMOS devices also need to endure high gate-to-drain voltages. Conventionally, the gate dielectrics of HVMOS devices are thick oxides that have greater thicknesses than the gate oxides of low-voltage MOS (LVMOS) devices such as core devices, which LVMOS devices may also be formed on a same chip as the HVMOS devices. The conventional formation processes of a HVMOS device and an LVMOS device may include forming a sacrificial oxide layer and a sacrificial nitride layer in both a HVMOS region and a LVMOS region, removing the sacrificial oxide layer and the sacrificial nitride layer from the HVMOS region and re-growing a thick oxide layer in the HVMOS region, removing the sacrificial oxide layer and the sacrificial nitride layer from the LVMOS region and re-growing a thin oxide layer in the LVMOS region (and possibly over the thick oxide layer also), and then forming a polysilicon layer over the thick oxide layer and the thin oxide layer. The above-mentioned layers are then patterned to form the gate stacks of the HVMOS device and the LVMOS device.

SUMMARY

In accordance with one aspect of the embodiment, an integrated circuit structure includes a semiconductor substrate and a high-voltage metal-oxide-semiconductor (HVMOS) device, which includes a first high-voltage well (HVW) region of a first conductivity type in the semiconductor substrate; a drain region of a second conductivity type opposite the first conductivity type in the semiconductor substrate and spaced apart from the first HVW region; a gate dielectric with at least a portion directly over the first HVW region; and a gate electrode over the gate dielectric. The gate dielectric includes a bottom gate oxide region; and a silicon nitride region over the bottom gate oxide region.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel method of forming high-voltage metal-oxide-semiconductor (HVMOS) devices and the resulting structures are provided. The intermediate stages of manufacturing an embodiment are illustrated. The variations of the embodiment are then discussed. Throughout the various views and illustrative embodiments, like reference numbers are used to designate like elements.

Figure 1:
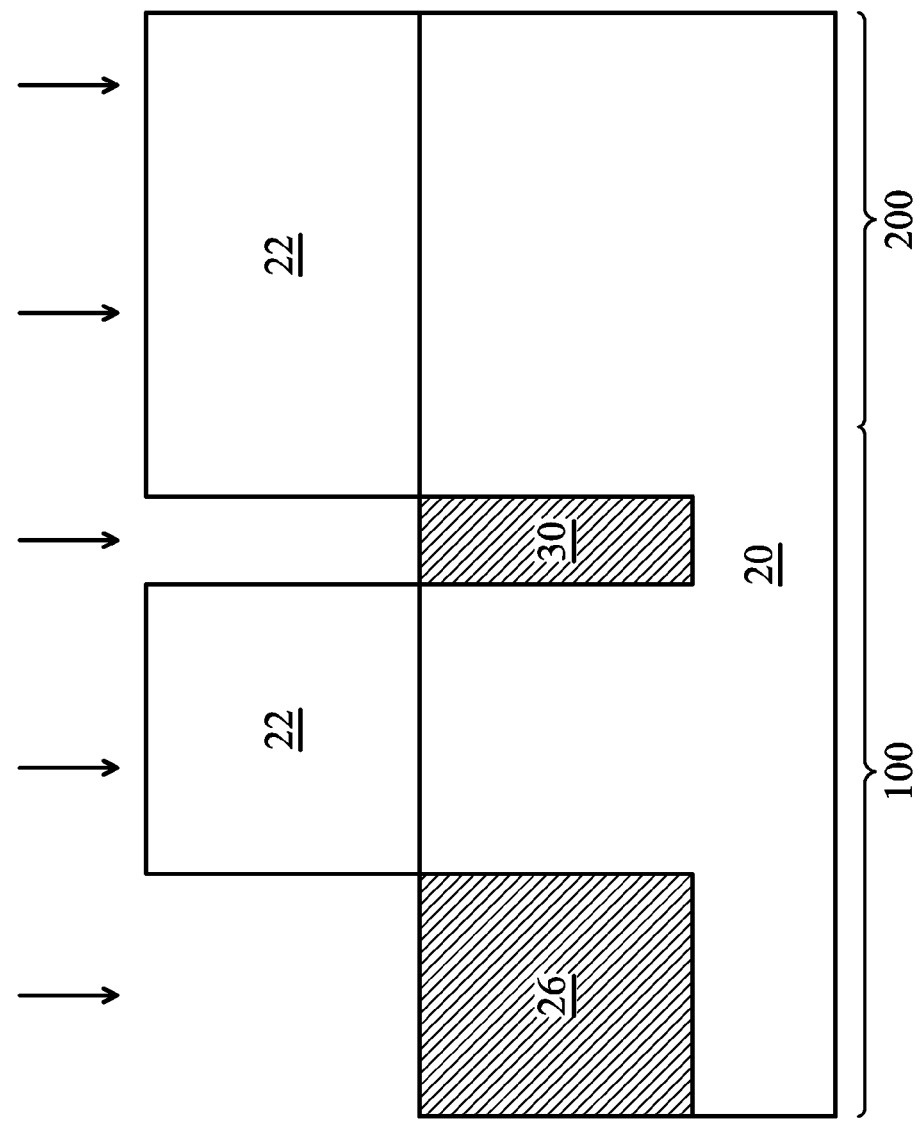
FIGS. 1 through 10 are cross-sectional views of intermediate stages in the manufacturing of a high-voltage metal-oxide-semiconductor (HVMOS) device and a low-voltage metal-oxide-semiconductor (LVMOS) device in accordance with an embodiment.

Referring to FIG. 1, substrate 20 is provided. Substrate 20 may comprise a semiconductor material such as silicon, although other semiconductor materials such as silicon germanium and the like may be used. Substrate 20 may be lightly doped with a p-type impurity, although it can also be doped with n-type impurities. In addition, substrate 20 includes a first portion in HVMOS region 100, in which a HVMOS device is to be formed, and a second portion in low-voltage metal-oxide-semiconductor (LVMOS) region 200, in which a LVMOS device is to be formed.

Photo resist 22 is formed and patterned to cover LVMOS region 200 and some of HVMOS region 100. High-voltage p-well (HVPW) regions 26 and 30 are then formed using photo resist 22 as a mask. In an embodiment, as symbolized by arrows, HVPW regions 26 and 30 are implanted with a p-type impurity, such as boron and/or indium. In an exemplary embodiment, the p-type impurity concentration in HVPW regions 26 and 30 is between about $10^{14}/cm^3$ and about $10^{17}/cm^3$, although higher or lower impurity concentrations are also applicable. Please note that although HVPW regions 26 and 30 may be two separate regions, they can also be portions of a continuous HVPW ring encircling high-voltage n-well (HVNW) region 28 (not shown in FIG. 1, please refer to FIG. 2). After the formation of HVPW regions 26 and 30, photo resist 22 is removed.

Figure 2:
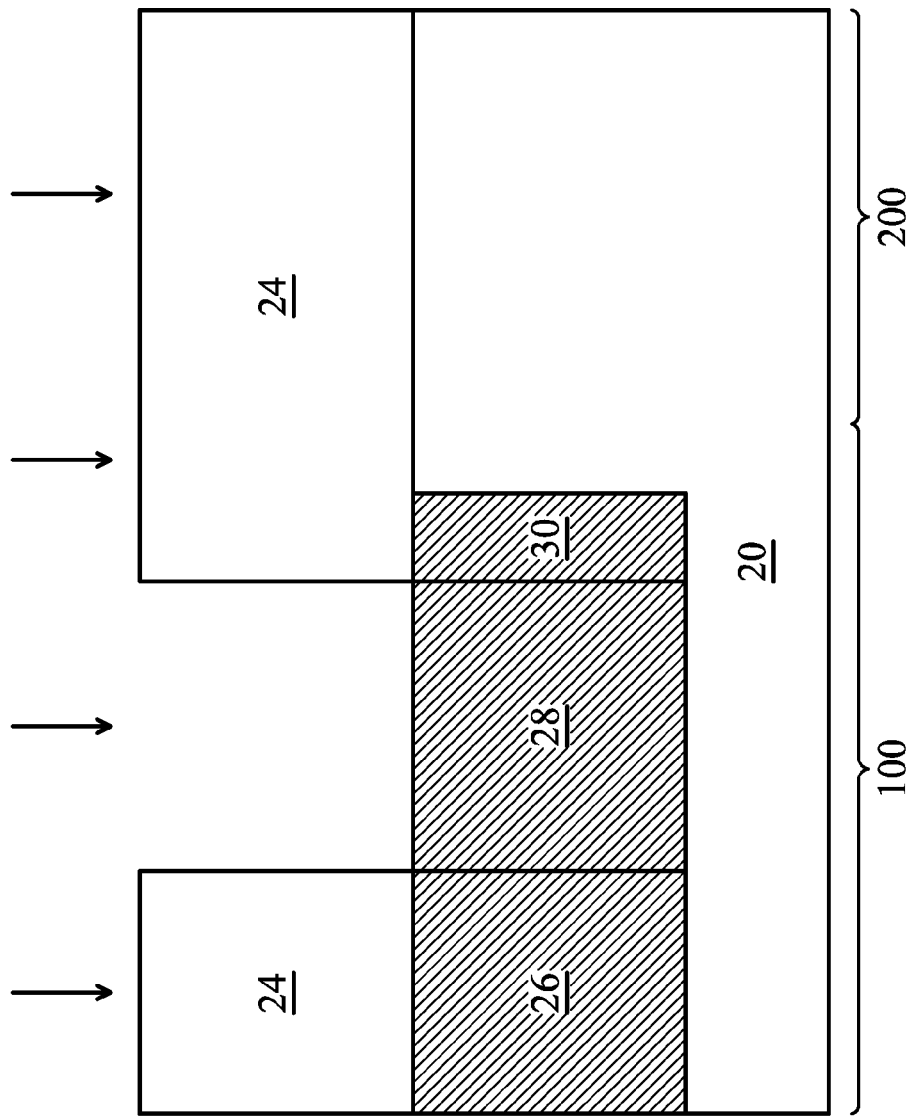

FIG. 2 illustrates the formation of high-voltage n-well (HVNW) region 28. Photo resist 24 is formed to mask the previously formed HVPW regions 26 and 30 and LVMOS region 200. An n-type impurity, such as phosphorous, antimony and/or arsenic, is implanted, wherein the implanting is symbolized by arrows. In an exemplary embodiment, HVNW region 28 has an impurity concentration between about $10^{14}/cm^3$ to about $10^{17}/cm^3$. One skilled in the art will realize that the order for forming HVNW region 28 and HVPW regions 26 and 30 is merely a design choice.

In alternative embodiments, HVPW regions 26 and 30 and HVNW region 28 may be formed by epitaxially growing a doped semiconductor layer on substrate 20. The doped semiconductor layer may be doped with an n-type impurity (or a p-type impurity) to a concentration of essentially the same as in HVNW region 28. Photo resist 24, which may be essentially the same as photo resist 22 in FIG. 1, is then formed, and HVPW regions 26 and 30 are formed by implanting a p-type impurity. The n-type impurity in the doped epitaxial semiconductor layer is neutralized by the implanted p-type impurity, and the net concentration of implanted HVPW regions 26 and 30 may be essentially the same as discussed in the preceding paragraphs. The un-implanted region of the doped semiconductor layer thus forms HVNW region 28. Alternatively, in the embodiment the epitaxially grown semiconductor layer is doped with a p-type impurity, an n-type impurity implantation may be performed to form HVNW region 28, while the un-implanted regions become HVPW regions 26 and 30.

Figure 3:
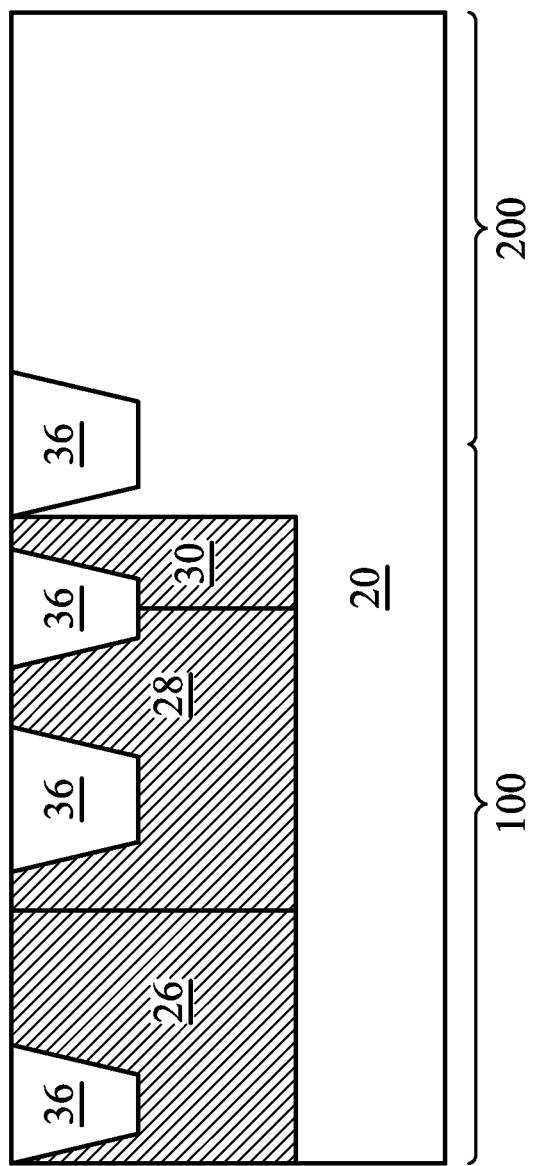

FIG. 3 illustrates the formation of insulation regions 36. In an embodiment, insulation regions 36 are formed by forming trenches in substrate 20, filling the trenches with a dielectric material, such as $SiO_2$ or a high-density plasma (HDP) oxide, and performing a chemical mechanical polish (CMP) to level the surface of the filled dielectric material to top surfaces of regions 26, 28, and 30. The resulting shallow trench isolation (STI) regions are insulation regions 36. In other embodiments, insulation regions 36 may be field oxide regions formed using local oxidation of silicon (LOCOS).

Figure 4:
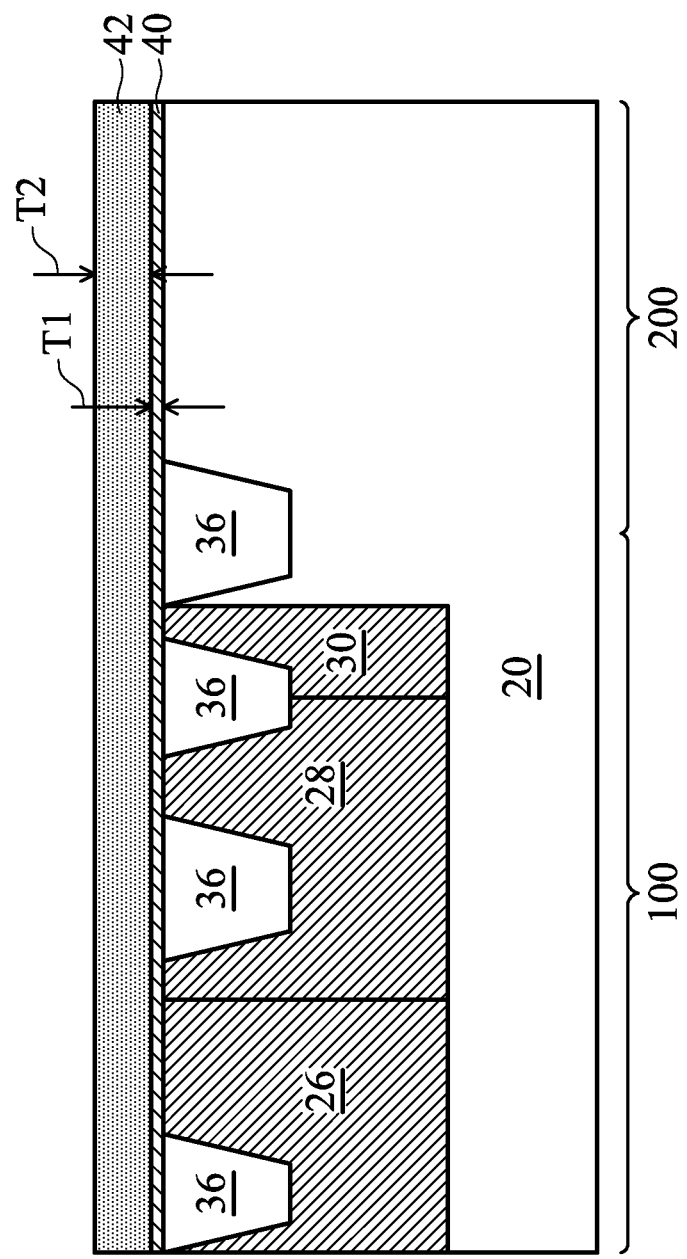

FIG. 4 illustrate the formation of oxide layer 40 (also referred to as a bottom gate oxide layer 40 throughout the description) and silicon nitride layer 42. The thickness T1 of bottom gate oxide layer 40 may be between about 5 Å and about 200 Å. One skilled in the art will realize, however, that the dimensions recited throughout the description are merely examples, and may change if different formation technologies are used. Bottom gate oxide layer 40 may be a thermal oxide layer formed at a temperature between about 800° C. and about 1100°, for example. Alternatively, bottom gate oxide layer 40 may be formed using plasma enhance chemical vapor deposition (PECVD) at a temperature between about 250° C. and about 400° C., rapid thermal oxidation at a temperature between about 700° C. and about 1000° C., or in-situ steam generation (ISSG).

Thickness T2 of silicon nitride layer 42 may be between about 100 Å and about 400 Å. Silicon nitride layer 42 may be a thermal nitride layer formed at a temperature between about 400° C. and about 800°, for example. Alternatively, silicon nitride layer 42 may be formed of PECVD at a temperature between about 250° C. and about 400° C.

Figure 5:
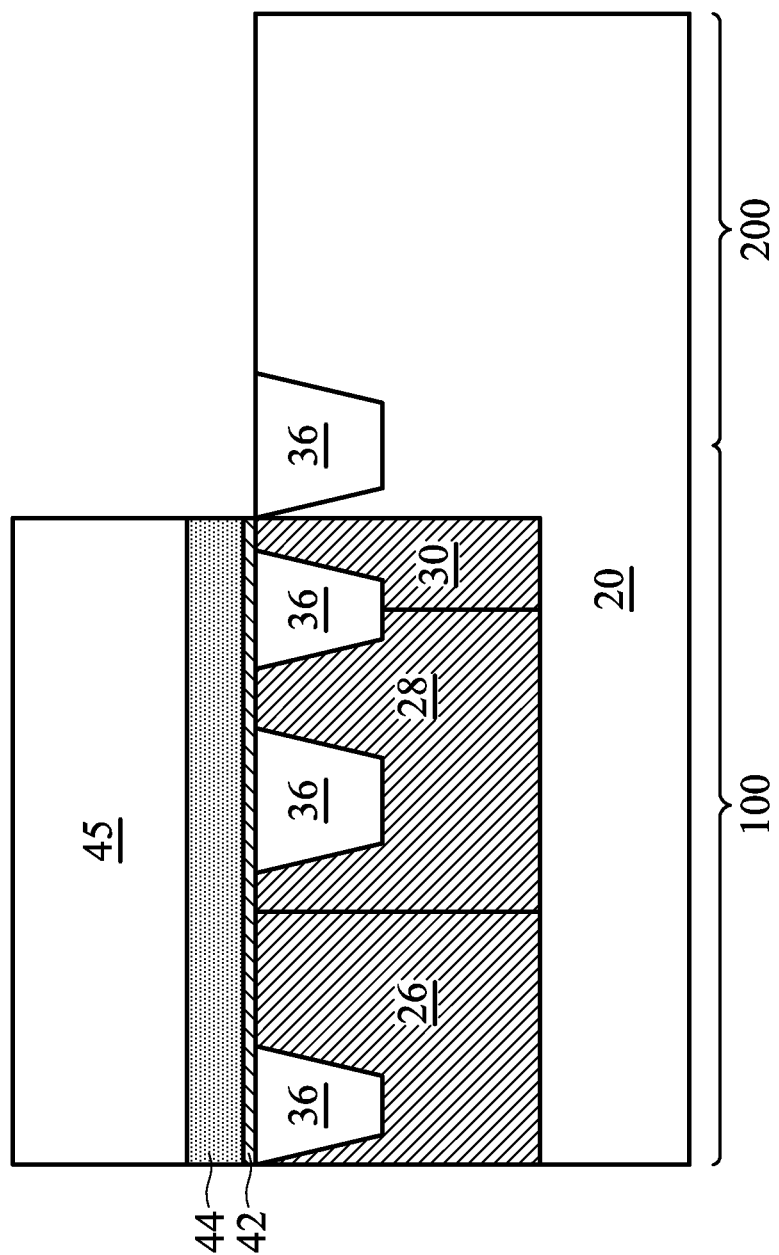
Figure 6:
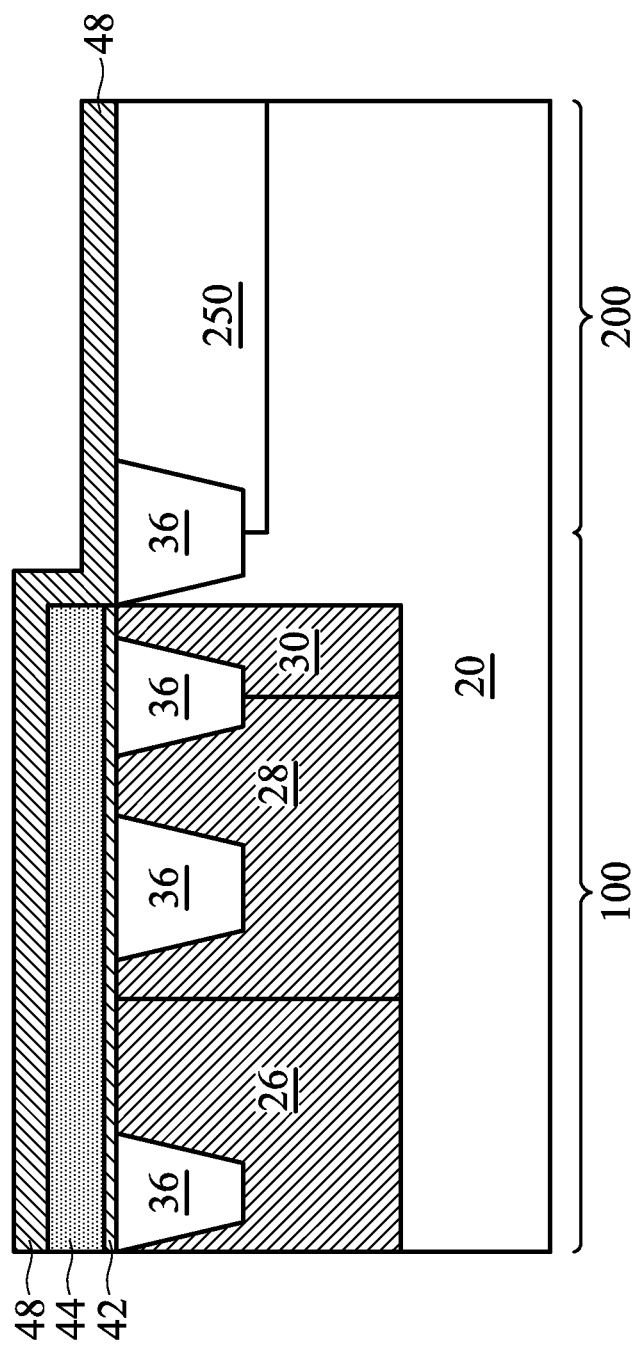

Referring to FIG. 5, photo resist 45 is formed to cover HVMOS region 100, while LVMOS region 200 is left open. The exposed portions of bottom gate oxide layer 40 and silicon nitride layer 42 in LVMOS region 200 are then removed, followed by the removal of photo resist 45. Next, as shown in FIG. 6, optional sacrificial oxide layer 48 is formed in LVMOS region 200. Sacrificial oxide layer 48 acts as a screen layer for implanting a p-type impurity into the portion of substrate 20 in LVMOS region 200, so that low-voltage well region 250 is formed in substrate 20. After the low-voltage well implantation, sacrificial oxide layer 48 is removed. In alternative embodiments, no sacrificial oxide layer is formed for the formation of low-voltage well region 250.

Figure 7:
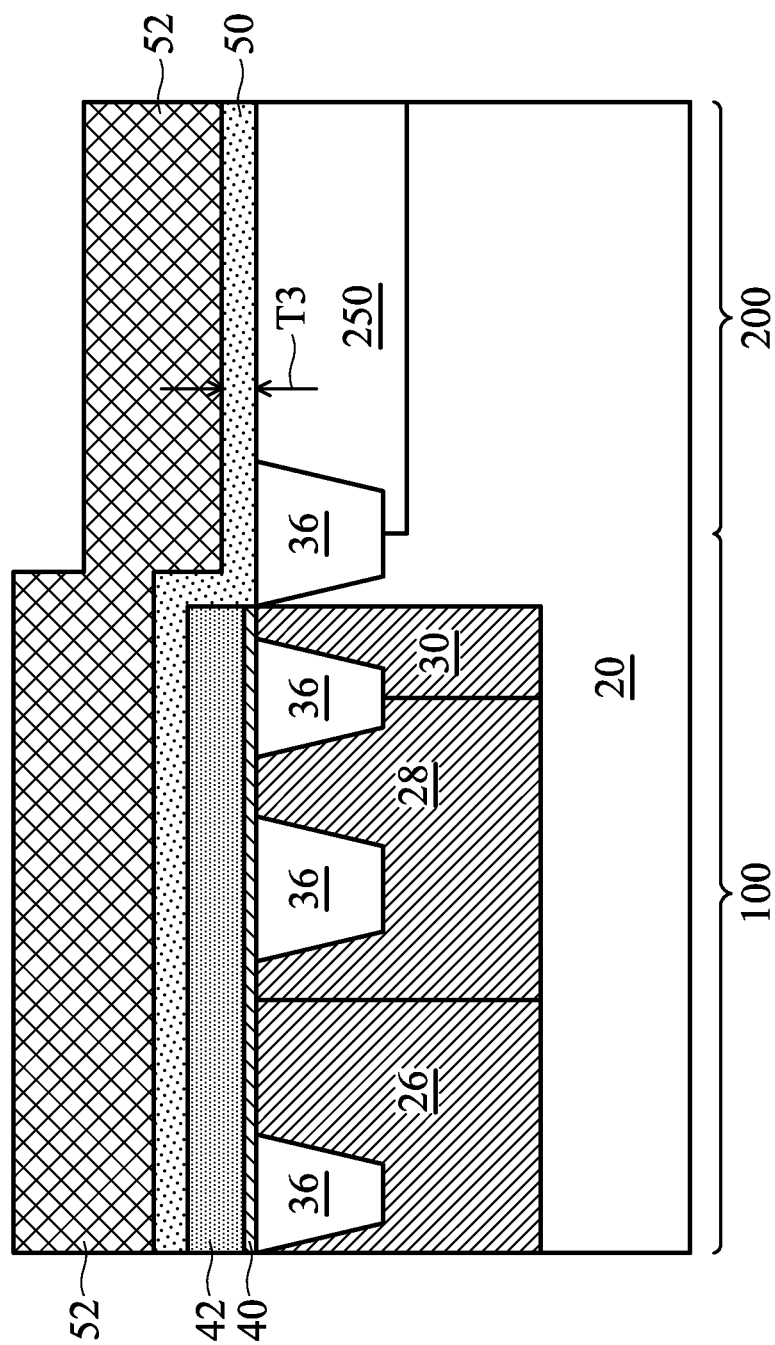

Referring to FIG. 7, oxide layer 50 (alternatively referred to as a top gate oxide layer 50 hereinafter) and polysilicon layer 52 are formed. The thickness T3 of top gate oxide layer 50 may be less than about 200 Å. Top gate oxide layer 50 may be a thermal oxide layer formed at a temperature between about 800° C. and about 1100°, for example. Accordingly, top gate oxide layer 50 will be formed in LVMOS region 200, but not on silicon nitride layer 42 in HVMOS region 100. Alternatively, top gate oxide layer 50 may be formed using rapid thermal oxidation at a temperature between about 700° C. and about 1000° C., for example, or formed using de-coupled plasma nitride (DPN). Accordingly, top gate oxide layer 50 will be formed in LVMOS region 200, and on silicon nitride layer 42, which is in HVMOS region 100. Polysilicon layer 52 may have a thickness greater than about 1000 Å.

Figure 8:
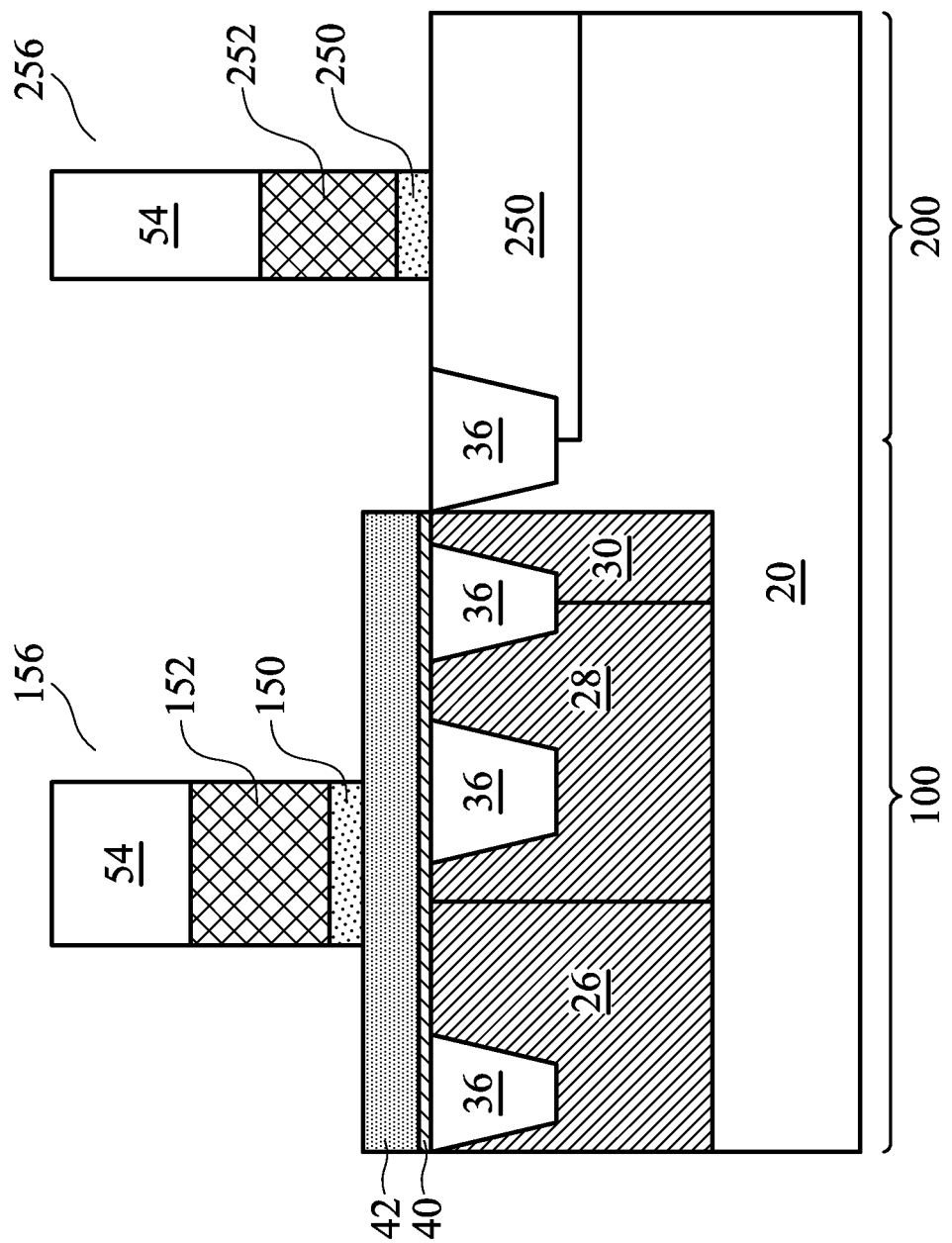

FIG. 8 illustrates the patterning of layers 50 and 52, with photo resist 54 formed acting as a mask. As are result, gate stack 156 and gate stack 256 are formed in HVMOS region 100 and LVMOS region 200, respectively. Gate stack 156 includes polysilicon region 152 and top gate oxide region 150, which are the remaining portions of polysilicon layer 52 and top gate oxide layer 50, respectively. Gate stack 256 includes polysilicon region 252 and gate oxide region 250, which are the remaining portions of polysilicon layer 52 and top gate oxide layer 50, respectively. Portions of silicon nitride layer 42 are thus exposed. Photo resist 54 is then removed.

Figure 9:
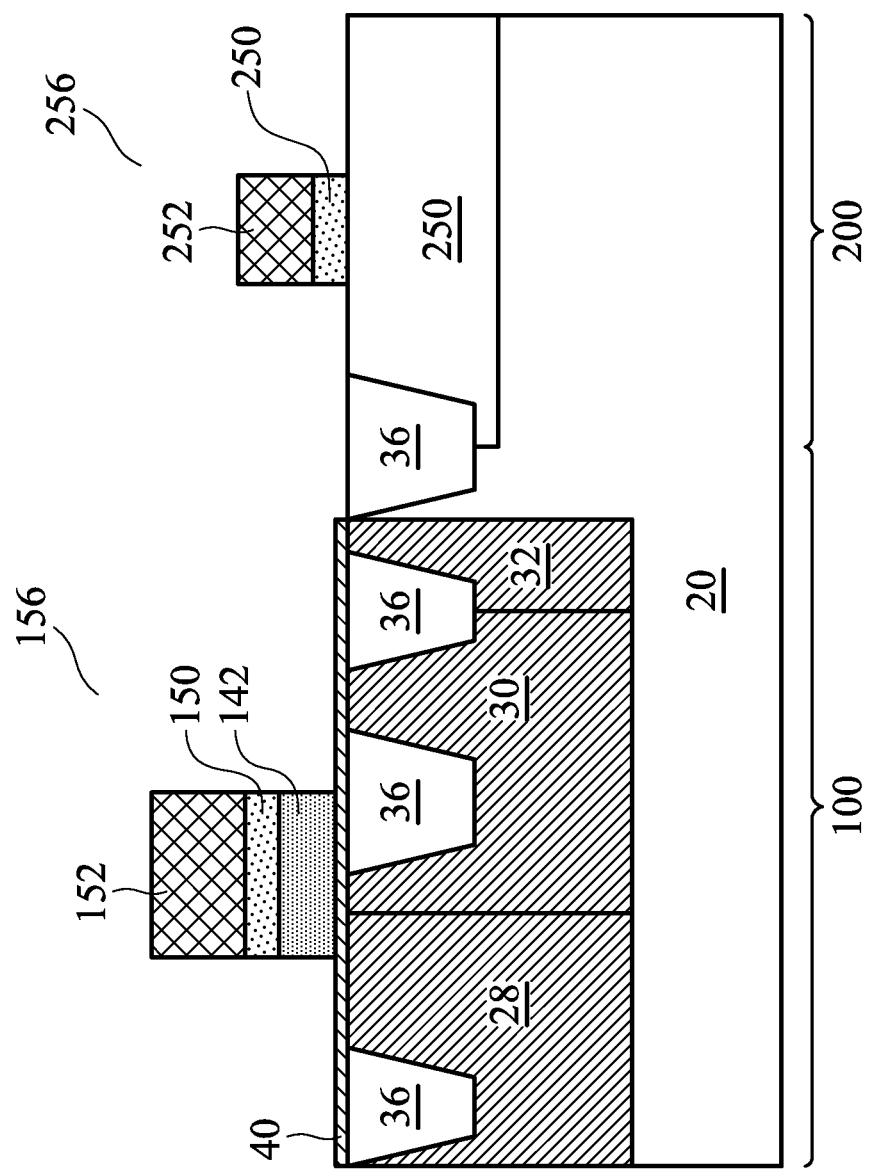

Next, as shown in FIG. 9, the exposed portion of silicon nitride layer 42 not covered by polysilicon region 152 is etched. The patterning of silicon nitride layer 42 may use an etchant having a high a selectivity between etching silicon nitride and etching oxide, so that portions of bottom gate oxide layer 40 may be left un-etched. Further, exposed portions of insulation regions 36 are also not damaged. It is observed that due to the use of silicon nitride in gate stack 156, the patterning of silicon nitride layer 42 may not require any lithography mask. If, however, the gate dielectric in HVMOS region 100 is formed of a thick oxide rather than the silicon nitride, since the thick oxide and insulation region 36 may be formed of a same material (and hence having no etching selectivity) a lithography mask would have been needed to cover LVMOS region 200 and some of insulation regions 36 during the patterning of the thick oxide. Otherwise, insulation regions 36 may be significantly damaged. Accordingly, with the use of silicon nitride, a lithography mask is saved, and the manufacturing cost is lowered.

Figure 10:
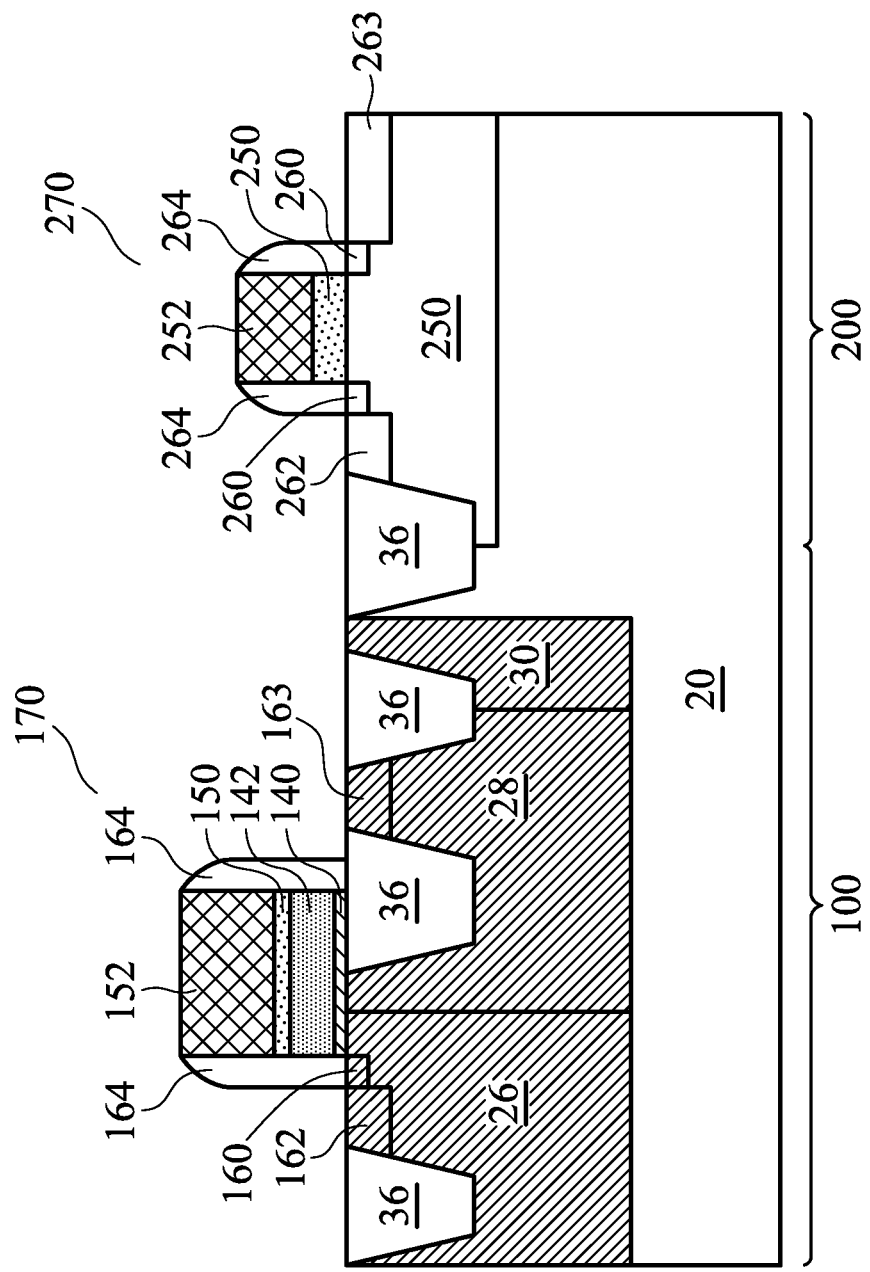

Referring to FIG. 10, lightly doped source and drain (LDD) region 160 and 260, source regions 162 and 262, and drain region 163 and 263 are formed. In an embodiment, the conductivity type of regions 160/260, 162/262, and 163/263 are n-type, and the resulting HVMOS device 170 and LVMOS device 270 are n-type MOS devices. In the implantation of 160, 162, and 163, the exposed portion of bottom gate oxide layer 40 (refer to FIG. 9) may be used as a screen layer. The portion of bottom gate oxide layer 40 not covered by polysilicon regions 152 are then removed, and the remaining portion of bottom gate oxide layer 40 (referred to as bottom gate oxide 140 hereinafter) forms a part of the gate dielectric of HVMOS device 170. Gate spacers 164 and 264 are also formed. The formation process of gate spacers 164 and 264 is known in the art, and hence is not repeated herein. In an exemplary embodiment, the resulting HVMOS device 170 and LVMOS device 270 are NMOS devices. Accordingly, source and drain regions 162/262 and 163/263 are N+ regions having an n-type impurity concentration greater than about 1 E20/$cm^3$, for example. HVMOS device 170 may sustain a gate-to-drain voltage greater than 5V, for example, while LVMOS device 270 may sustain a gate-to-drain voltage lower than 5V, for example.

Figure 11:
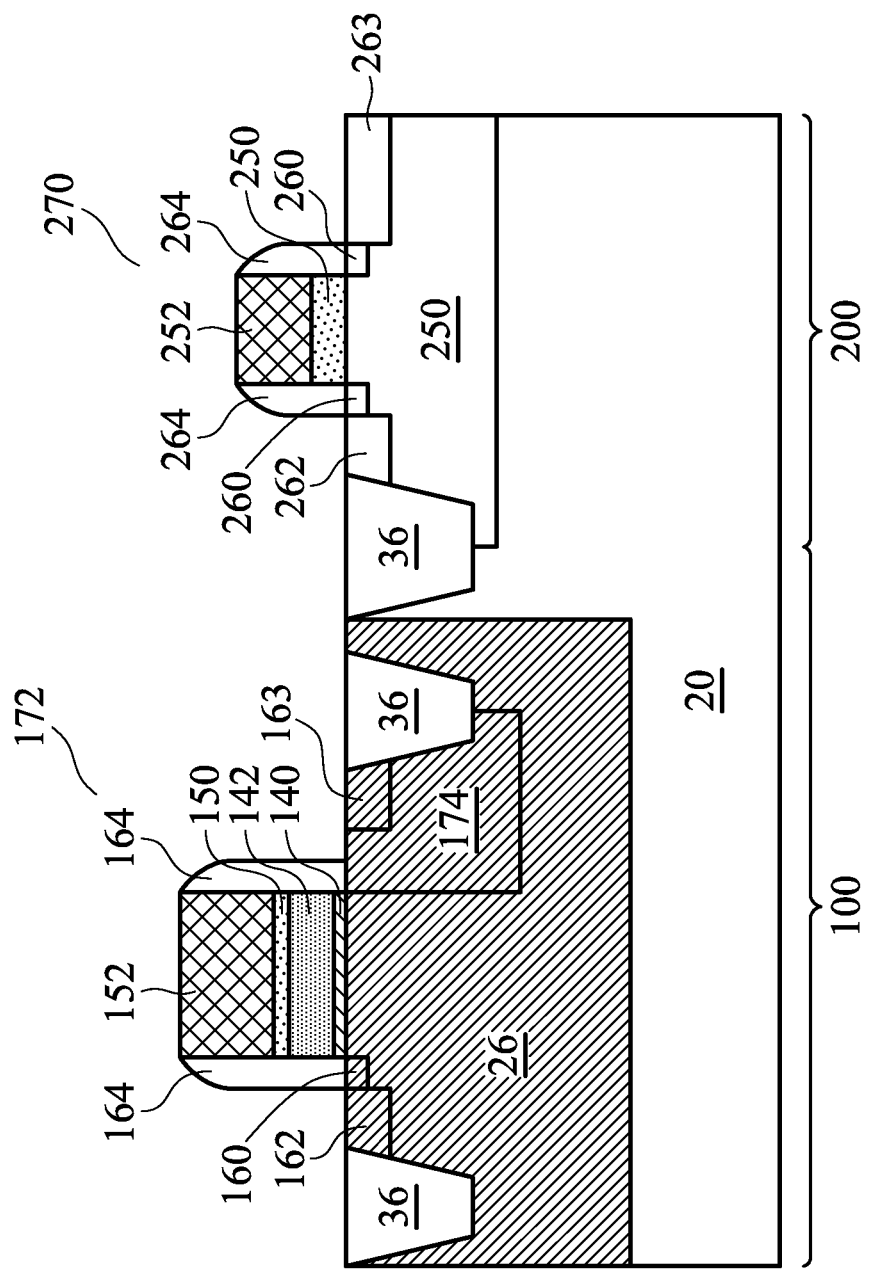
FIG. 11 illustrates a cross-sectional view of a double-diffused drain metal-oxide-semiconductor (DDDMOS) device and a LVMOS device.

The HVMOS device 170 as shown in FIG. 10 is a lateral-diffused metal-oxide-semiconductor (LDMOS) device. In alternative embodiments, as shown in FIG. 11, double-diffused drain MOS (DDDMOS) device 172 may be formed, which includes an n-type diffused drain 174, while HVNW region 28 and one of insulation regions 36 are omitted. Diffused drain region 174 may have a low impurity concentration, for example, less than about 5E16/$cm^3$, so that DDDMOS device 172 may sustain a high gate-to-drain voltage. Similar to LDMOS device 170, DDDMOS device 172 also includes bottom gate oxide region 140, silicon nitride 142, and optionally top oxide region 150. The formation process of DDDMOS device 172 is readily appreciated by applying the teaching regarding LDMOS 170.

Although the above-discussed embodiments provide methods of forming n-type HVMOS devices, one skilled in the art will realize that the teaching provided is readily available for the formation of p-type MOS devices such as p-type LDMOS devices and p-type DDDMOS devices, with the conductivity types of the respective well regions, LDD region and source/drain regions inverted.

In the embodiments of the disclosure, the HVMOS devices include silicon nitride regions that replace thick gate oxides. Accordingly, the respective gate capacitances are increased due to the higher k value of silicon nitride compared to silicon oxide. The gate breakdown voltage is also increased since silicon nitride can sustain about twice the electrical field than silicon oxide. In addition, the processes for forming the embodiments are simple. For example, compared to the processes for forming HVMOS devices comprising thick gate oxides, two lithography masks can be saved, resulting in a reduced manufacturing cost.

Although the embodiments and their advantages have been described in detail, it should be understood that various changes, substitutions and alterations can be made herein without departing from the spirit and scope of the embodiments as defined by the appended claims. Moreover, the scope of the present Application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
    a semiconductor substrate;
    a high-voltage metal-oxide-semiconductor (HVMOS) device comprising:
        a first high-voltage well (HVW) region of a first conductivity type in the semiconductor substrate;
        a drain region of a second conductivity type opposite the first conductivity type in the semiconductor substrate and spaced apart from the first HVW region;
        a gate dielectric with at least a portion directly over the first HVW region, wherein the gate dielectric comprises:
            a bottom gate oxide region; and
            a silicon nitride region over the bottom gate oxide region; and
        a gate electrode over the gate dielectric.

2. The integrated circuit structure of claim 1, wherein the gate dielectric further comprises a top gate oxide region over the silicon nitride region.

3. The integrated circuit structure of claim 1, wherein the gate electrode comprises a polysilicon region.

4. The integrated circuit structure of claim 1 further comprising a low-voltage MOS (LVMOS) device, wherein the LVMOS device comprises a gate stack comprising a gate oxide over the semiconductor substrate, and wherein the bottom gate oxide in the gate dielectric of the HVMOS device and the gate oxide of the LVMOS device are formed of a same material and have substantially a same thickness.

5. The integrated circuit structure of claim 4, wherein the gate stack of the LVMOS device does not comprise any silicon nitride region.

6. The integrated circuit structure of claim 1 further comprising:
    a second HVW region of the second conductivity type in the semiconductor substrate and laterally adjoining the first HVW region; and
    an insulation region in the second HVW region and horizontally spacing the drain region apart from the gate dielectric of the HVMOS device, wherein the gate dielectric extends directly over the second HVW region and the insulation region.

7. The integrated circuit structure of claim 1, wherein the HVMOS device further comprises a diffused drain region in the semiconductor substrate and horizontally spacing the drain region apart from the gate dielectric, with the diffused drain region having a lower impurity concentration than the drain region, wherein the first HVW region extends directly underlying the diffused drain region.

8. An integrated circuit structure comprising:
    a semiconductor substrate;
    a high-voltage metal-oxide-semiconductor (HVMOS) device comprising:
        a first gate oxide region directly over the semiconductor substrate;
        a silicon nitride region over the first gate oxide region;
        a first polysilicon region over the silicon nitride region;
        a high-voltage well (HVW) region of a first conductivity type in the semiconductor substrate and directly underlying a first portion of the first gate oxide region;
        a drain region of a second conductivity type opposite the first conductivity type in the HVW region; and
        a diffused drain region of the second conductivity type comprising a portion horizontally spacing the drain region apart from the first gate oxide region, wherein the HVW region extends directly underlying the diffused drain region, and wherein the drain region is in the diffused drain region; and
    a low-voltage metal-oxide-semiconductor (LVMOS) device comprising:
        a second gate oxide region over the semiconductor substrate; and
        a second polysilicon region over the second gate oxide region, with no silicon nitride region between the second gate oxide region and the second polysilicon region, wherein the first polysilicon region and the second polysilicon region have substantially a same thickness.

9. The integrated circuit structure of claim 8, wherein the HVMOS device further comprises:
    a first HVW region of a first conductivity type in the semiconductor substrate and directly underlying a first portion of the first gate oxide region; and
    a second HVW region of a second conductivity type opposite the first conductivity type in the semiconductor substrate and directly underlying a second portion of the first gate oxide, wherein the second HVW region laterally adjoins the first HVW region.

10. The integrated circuit structure of claim 8, wherein the HVMOS device further comprises a third gate oxide region between the silicon nitride region and the first polysilicon region, and wherein the second gate oxide region and the third gate oxide region have substantially a same thickness.

11. The integrated circuit structure of claim 8, wherein the portion of the diffused drain region is misaligned with the first gate oxide region and the drain region.

12. An integrated circuit structure comprising:
a semiconductor substrate; and
a high-voltage metal-oxide-semiconductor (HVMOS) device comprising:
 a bottom gate oxide region over the semiconductor substrate;
 a silicon nitride region over the bottom gate oxide region;
 a top gate oxide region over the silicon nitride region;
 a polysilicon region over the top gate oxide region;
 a high-voltage well (HVW) region of a first conductivity type in the semiconductor substrate and directly underlying a first portion of the bottom gate oxide region;
 a drain region of a second conductivity type opposite the first conductivity type in the semiconductor substrate; and
 a diffused drain region of the second conductivity type horizontally spacing the drain region apart from the bottom gate oxide region, wherein the HVW region extends directly underlying the diffused drain region, and wherein the diffused drain region has an impurity concentration lower than an impurity concentration of the drain region.

13. The integrated circuit structure of claim 12, wherein the HVMOS device further comprises:
a first HVW region of the first conductivity type in the semiconductor substrate and directly underlying a first portion of the bottom gate oxide region; and
a second HVW region of the second conductivity type in the semiconductor substrate and directly underlying a second portion of the bottom gate oxide region, wherein the first HVW region laterally adjoins the second HVW region.

14. The integrated circuit structure of claim 12, wherein a portion of the diffused drain region spacing the drain region apart from the bottom gate oxide region is misaligned with the bottom gate oxide region and the drain region.

15. A method of forming an integrated circuit structure, the method comprising:
forming a bottom gate oxide layer over a semiconductor substrate, wherein the semiconductor substrate comprises a first portion in a HVMOS region and a second portion in a LVMOS region;
forming a silicon nitride layer over the bottom gate oxide layer;
forming a gate electrode layer over the silicon nitride layer;
patterning the gate electrode layer, the silicon nitride layer, and the bottom gate oxide layer to form a first gate stack of a HVMOS device in the HVMOS region;
forming a drain region of the HVMOS device in the semiconductor substrate; and
forming a top gate oxide layer, wherein the top gate oxide layer comprises a first portion in the HVMOS region, with the first portion being over the silicon nitride layer and under the gate electrode layer, and a second portion in the LVMOS region and contacting the semiconductor substrate.

16. The method of claim 15, wherein after the step of patterning, a remaining portion of the gate electrode layer and a remaining portion of the second portion of the top gate oxide layer form a second gate stack of a LVMOS device in the LVMOS region.

17. The method of claim 15, wherein the step of patterning the silicon nitride layer is performed without using a mask to cover the LVMOS region.

18. The method of claim 15 further comprising:
before the step of forming the bottom oxide layer, forming a first high-voltage well (HVW) region of a first conductivity type in the semiconductor substrate, wherein the first HVW region comprises a portion directly underlying a first portion of the first gate stack;
forming a second HVW region of a second conductivity type opposite the first conductivity type in the semiconductor substrate, wherein the second HVW region comprises a portion directly underlying a second portion of the first gate stack; and
forming an insulation region in the second HVW region and laterally spacing the first gate stack apart from the drain region.

19. The method of claim 15 further comprising:
before the step of forming the bottom oxide layer, forming a high-voltage well (HVW) region of a first conductivity type in the semiconductor substrate, wherein the HVW region comprises a portion directly underlying a first portion of the first gate stack; and
forming a diffused drain region of a second conductivity type opposite the first conductivity type in the HVW region and laterally spacing the first gate stack apart from the drain region, wherein the diffused drain region has an impurity concentration lower than an impurity concentration of the drain region.

* * * * *